(12) United States Patent
Horiuchi

(10) Patent No.: US 12,144,114 B2
(45) Date of Patent: Nov. 12, 2024

(54) ELECTRONIC ELEMENT MOUNTING SUBSTRATE, ELECTRONIC DEVICE, AND ELECTRONIC MODULE

(71) Applicant: KYOCERA Corporation, Kyoto (JP)

(72) Inventor: Kanae Horiuchi, Kyoto (JP)

(73) Assignee: KYOCERA CORPORATION, Kyoto (JP)

(*) Notice: Subject to any disclaimer, the term of this patent is extended or adjusted under 35 U.S.C. 154(b) by 527 days.

(21) Appl. No.: 17/613,514

(22) PCT Filed: May 28, 2020

(86) PCT No.: PCT/JP2020/021181
§ 371 (c)(1),
(2) Date: Jun. 30, 2022

(87) PCT Pub. No.: WO2020/241775
PCT Pub. Date: Dec. 3, 2020

(65) Prior Publication Data
US 2022/0361333 A1 Nov. 10, 2022

(30) Foreign Application Priority Data

May 29, 2019 (JP) ................................. 2019-100404

(51) Int. Cl.
*H05K 1/11* (2006.01)
*H05K 1/02* (2006.01)
*H05K 1/18* (2006.01)

(52) U.S. Cl.
CPC ........... *H05K 1/116* (2013.01); *H05K 1/0298* (2013.01); *H05K 1/184* (2013.01); *H05K 2201/09454* (2013.01)

(58) Field of Classification Search
CPC ...... H05K 1/116; H05K 1/0298; H05K 1/184; H05K 2201/09454
See application file for complete search history.

(56) References Cited

U.S. PATENT DOCUMENTS 9,056,442 B2 * 6/2015 Otsubo ................... B32B 3/266
9,523,709 B2 * 12/2016 Otsubo ................ H05K 3/4629
(Continued)

FOREIGN PATENT DOCUMENTS

JP 2-8174 U 1/1990
JP 03-284896 A 12/1991
(Continued)

*Primary Examiner* — Sherman Ng
(74) *Attorney, Agent, or Firm* — Volpe Koenig

(57) ABSTRACT

An electronic element mounting substrate includes a substrate including a first layer, a second layer located on a lower surface of the first layer, and a third layer located on a lower surface of the second layer, and on which an electronic element is to be mounted. The substrate has a via conductor that passes through the first layer to the third layer in a vertical direction. The substrate includes respective electrical conductor layers located between the respective layers and connected to the via conductor in a plan perspective. Each electrical conductor layer includes a land portion surrounding the via conductor, a clearance portion surrounding the land portion, and a peripheral portion surrounding the clearance portion and electrically insulated from the land portion with the clearance portion interposed between the land portion and the peripheral portion. The first land portion has, in a plan perspective, a first portion overlapping the second land portion, and the first clearance portion has, in a plan perspective, a second portion not overlapping the second clearance portion. The first peripheral portion and the second peripheral portion each have, in a vertical cross-sectional view, an end portion that becomes thinner as a distance from the via conductor increases.

18 Claims, 9 Drawing Sheets

(56) References Cited

U.S. PATENT DOCUMENTS

| | | | | |
|---|---|---|---|---|
| 2005/0102831 A1* | 5/2005 | Saiki | ................... | H05K 3/4661 |
| | | | | 29/846 |
| 2009/0294167 A1* | 12/2009 | Nomiya | ............... | H05K 1/0271 |
| | | | | 174/262 |
| 2017/0196096 A1* | 7/2017 | Ishihara | ................. | H05K 1/113 |
| 2019/0013266 A1* | 1/2019 | Iwai | ................... | H01L 21/4857 |

FOREIGN PATENT DOCUMENTS

| | | |
|---|---|---|
| JP | 06-85457 A | 3/1994 |
| JP | 07-273455 A | 10/1995 |
| JP | 10-154773 A | 6/1998 |
| JP | 2017-183337 A | 10/2017 |
| JP | 2019-079987 A | 5/2019 |

\* cited by examiner

ELECTRONIC ELEMENT MOUNTING SUBSTRATE, ELECTRONIC DEVICE, AND ELECTRONIC MODULE

TECHNICAL FIELD

The present disclosure relates to an electronic element mounting substrate on which an electronic element or other components are mounted, an electronic device, and an electronic module.

BACKGROUND ART

An electronic element mounting substrate is known that includes a substrate which includes an insulating layer and a wiring layer and which is provided with a through-hole conductor. Further, an electronic device using such an electronic element mounting substrate is known to have a structure in which a lid is mounted on an upper surface of a recessed portion (see JP 2017-183337 A).

In recent years, electronic devices have been required to be thinner. Therefore, the respective insulating layers of the electronic element mounting substrate used in the electronic device have been also required to be thinner. In order to increase the conductivity of the through-hole conductor of the electronic element mounting substrate, a land pattern is provided on a front surface and/or a lower surface of each insulating layer. To improve the insulating property from a pattern connected to another potential in the same layer, a clearance may be provided between this land pattern and the pattern connected to the other potential. In this case, when some or all of the plurality of through-hole conductors overlap in a top view, these clearances partially or wholly overlap in a top view. There has been a concern that when a plurality of these clearances overlap, the surface of the electronic element mounting substrate becomes uneven, or a space is created around the edge of the clearance inside the electronic element mounting substrate, resulting in a decrease in strength or cracking of the electronic element mounting substrate.

SUMMARY

An electronic element mounting substrate according to one aspect of the present disclosure includes a substrate, a via conductor, a first electrical conductor layer, and a second electrical conductor layer. The substrate includes a first layer, a second layer located on a lower surface of the first layer, and a third layer located on a lower surface of the second layer, and on which an electronic element is to be mounted. The via conductor passes through from the first layer to the third layer in a vertical direction. The first electrical conductor layer is located between the first layer and the second layer, and is connected to the via conductor in a plan perspective. The second electrical conductor layer is located between the second layer and the third layer, and is connected to the via conductor in a plan perspective. Further, the first electrical conductor layer includes, in a plan perspective, a first land portion surrounding the via conductor and connected to the via conductor, a first clearance portion surrounding the first land portion, and a first peripheral portion surrounding the first clearance portion and electrically insulated from the first land portion with the first clearance portion interposed between the first land portion and the first peripheral portion. The second electrical conductor layer includes, in a plan perspective, a second land portion surrounding the via conductor and connected to the via conductor, a second clearance portion surrounding the second land portion, and a second peripheral portion surrounding the second clearance portion and electrically insulated from the second land portion with the second clearance portion interposed between the second land portion and the second peripheral portion. Further, the first land portion has, in a plan perspective, a first portion overlapping the second land portion, and the first clearance portion has, in a plan perspective, a second portion not overlapping the second clearance portion. Furthermore, the first peripheral portion and the second peripheral portion each have, in a vertical cross-sectional view, an end portion that becomes thinner as a distance from the via conductor increases.

An electronic device according to one aspect of the present disclosure includes the above-described electronic element mounting substrate and an electronic element mounted on the electronic element mounting substrate.

An electronic module according to one aspect of the present disclosure includes the above-described electronic device and a casing surrounding the electronic device.

DESCRIPTION OF EMBODIMENTS

Configuration of Electronic Element Mounting Substrate and Electronic Device

Several exemplary embodiments of the present disclosure will be described hereinafter with reference to the drawings. In the following description, a configuration in which an electronic element is mounted on an electronic element mounting substrate is defined as an electronic device. In addition, a configuration having a casing or a member provided on an upper surface side of the electronic element mounting substrate or surrounding the electronic device is defined as an electronic module. With respect to the electronic element mounting substrate, the electronic device, and the electronic module, any direction may be defined as upward or downward, but for the sake of simplicity, the Cartesian coordinate system XYZ will be used herein, with a positive side in the Z direction defined as upward.

First Embodiment

Figure 1A:
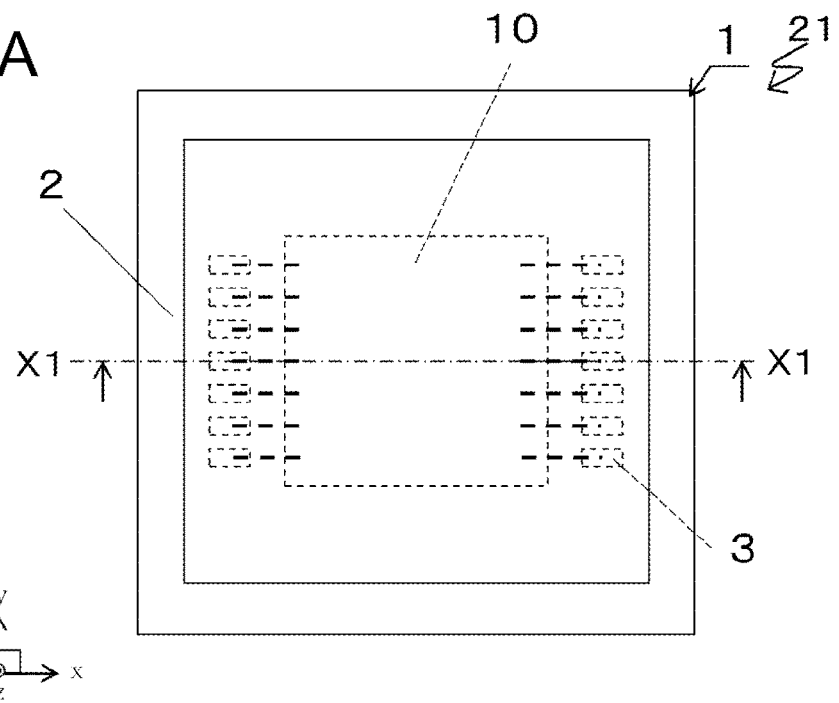
FIG. 1A is a top view illustrating the outer appearance of an electronic element mounting substrate and an electronic device according to a first embodiment of the present disclosure.
Figure 1B:
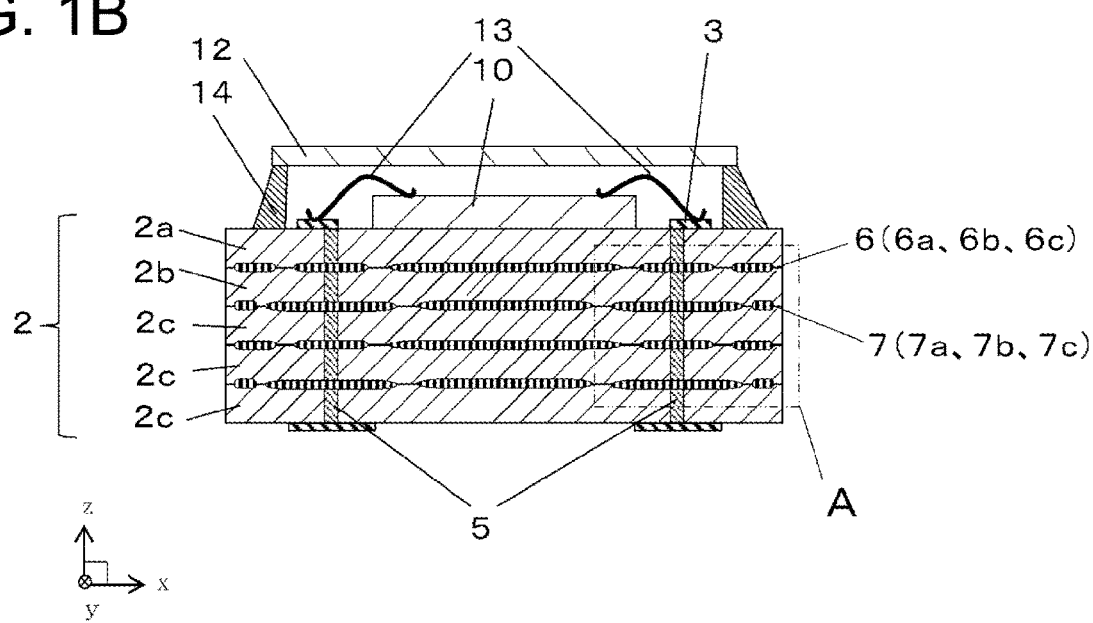
FIG. 1B is a vertical sectional view taken along line X1-X1 in FIG. 1A.
Figure 2A:
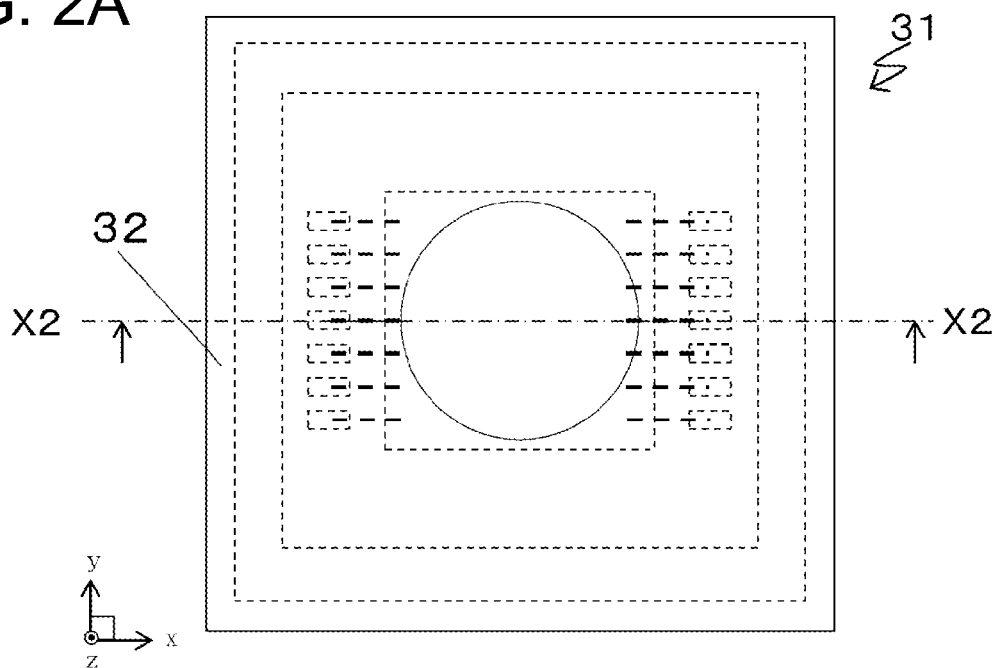
FIG. 2A is a top view illustrating the outer appearance of an electronic module according to another aspect of the first embodiment of the present disclosure.
Figure 2B:
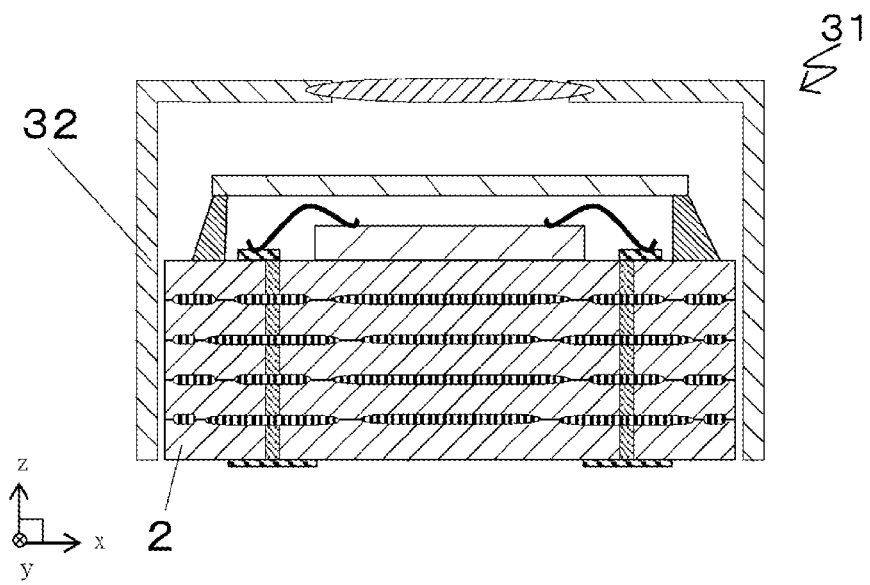
FIG. 2B is a vertical sectional view taken along line X2-X2 in FIG. 2A.

An electronic element mounting substrate 1 and an electronic device 21 provided with the electronic element mounting substrate 1 according to a first embodiment of the present disclosure will be described with reference to FIGS. 1 to 9. Note that FIG. 1 illustrates a top view and a cross-sectional view of the electronic device 21, and FIG. 2 illustrates a top view and a cross-sectional view of an electronic module 31. Further, FIGS. 3 to 7 illustrate enlarged vertical sectional views of a main part A of the electronic element mounting substrate 1. Furthermore, FIGS. 8 and 9 illustrate enlarged plan perspectives and enlarged cross-sectional views of the main part A of the electronic element mounting substrate 1.

The electronic element mounting substrate 1 includes a substrate 2 including a first layer 2a, a second layer 2b located on a lower surface of the first layer 2a, and a third layer 2c located on a lower surface of the second layer 2b, and on which an electronic element 10 is to be mounted. The substrate 2 has a via conductor 5 that continuously passes through the first layer 2a, the second layer 2b, and the third layer 2c in a vertical direction. The substrate 2 includes a first electrical conductor layer 6 that is located between the first layer 2a and the second layer 2b and is connected to the via conductor 5 in a plan perspective. The substrate 2 includes a second electrical conductor layer 7 that is located between the second layer 2b and the third layer 2c and is connected to the via conductor 5 in a plan perspective. In a plan perspective, the first electrical conductor layer 6 has a first land portion 6a surrounding the via conductor 5, a first clearance portion 6c surrounding the first land portion 6a, and a first peripheral portion 6b surrounding the first clearance portion 6c and electrically insulated from the first land portion 6a with the first clearance portion 6c interposed between the first land portion 6a and the first peripheral portion 6b. In a plan perspective, the second electrical conductor layer 7 has a second land portion 7a surrounding the via conductor 5, a second clearance portion 7c surrounding the second land portion 7a, and a second peripheral portion 7b surrounding the second clearance portion 7c and electrically insulated from the second land portion 7a with the second clearance portion 7c interposed between the second land portion 7a and the second peripheral portion 7b. In the substrate 2, the first land portion 6a has a first portion 6e overlapping the second land portion 7a. Further, in a plan perspective, the first clearance portion 6c has a second portion 6f not overlapping the second clearance portion 7c. In other words, the first clearance portion 6c and the second clearance portion 7c differ in size and/or shape in a plan perspective. The first peripheral portion 6b and the second peripheral portion 7b of the substrate 2 each have an end portion (first end portion 6d and second end portion 7d) that becomes thinner as a distance from the via conductor 5 increases in a cross-sectional view in a vertical direction of the substrate 2, that is, in the z direction.

The electronic element mounting substrate 1 includes a substrate 2 including a first layer 2a, a second layer 2b located on a lower surface of the first layer 2a, and a third layer 2c located on a lower surface of the second layer 2b, and on which an electronic element 10 is to be mounted. The substrate 2 has a mounting region on an upper surface on which the electronic element 10 is to be mounted. The mounting region is a region on which at least one or more electronic elements 10 are mounted, and can be appropriately defined as, for example, inside or outside of the outermost periphery of electrode pads 3, which will be described later. Further, a component mounted on the mounting region is not limited to the electronic element 10, and may be, for example, an electronic component, and the number of electronic elements 10 and/or electronic components is not specified.

Examples of the electrically insulating ceramic used as the material of the insulating layers included in the substrate 2 include an aluminum oxide-based sintered body, a mullite-based sintered body, a silicon carbide-based sintered body, an aluminum nitride-based sintered body, a silicon nitride-based sintered body, and a glass ceramic sintered body. Examples of the resin used as the material of the insulating layers forming the substrate 2 include a thermoplastic resin, an epoxy resin, a polyimide resin, an acrylic resin, a phenol resin, a fluorine-based resin, and the like. Examples of the fluorine-based resin include an ethylene tetrafluoride resin.

The substrate 2 may be formed of five insulating layers as illustrated in FIG. 1, or may be formed of four or less or six or more insulating layers. When the number of insulating layers is four or less, the thickness of the electronic element mounting substrate 1 can be reduced. On the other hand, when the number of insulating layers is six or more, the rigidity of the electronic element mounting substrate 1 can be increased.

For example, one side of an outermost periphery of the electronic element mounting substrate 1 may have a size of from 0.3 mm to 10 cm, and when the electronic element mounting substrate 1 has a quadrilateral shape in a plan perspective, the shape may be square or rectangular. Further, for example, the thickness of the electronic element mounting substrate 1 may be 0.2 mm or more.

The substrate 2 has a via conductor 5 that continuously passes through the first layer 2a, the second layer 2b, and the third layer 2c in the vertical direction. The substrate 2 includes the first electrical conductor layer 6 located between the first layer 2a and the second layer 2b and connected to the via conductor 5 in a plan perspective. The substrate 2 includes the second electrical conductor layer 7 located between the second layer 2b and the third layer 2c and connected to the via conductor 5 in a plan perspective.

Further, an external circuit connection electrode may be provided on the upper surface, the side surface, or the lower surface of the substrate 2 of the electronic element mounting substrate 1. The external circuit connection electrode may electrically connect the base 2 to an external circuit board or the electronic device 21 to an external circuit board.

Further, in addition to the electrode pads 3 and/or the external circuit connection electrode, electrodes formed between the insulating layers, internal wiring electrical conductors, and through-hole conductors other than the via conductor 5 vertically connecting the internal wiring electrical conductors may be provided on the upper surface or the lower surface of the base 2. These electrodes, internal wiring electrical conductors, or through-hole conductors may be exposed on the surface of the substrate 2. The electrode pads 3 and/or the external circuit connection electrode may each be electrically connected by the electrodes, the internal wiring electrical conductors, or the through-hole conductors.

When the substrate 2 is made of an electrically insulating ceramic, the electrode pads 3, the via conductor 5, the first electrical conductor layer 6, the second electrical conductor layer 7, the external circuit connection electrode, the electrode, the internal wiring electrical conductors, and/or the through-hole conductors contain tungsten (W), molybdenum (Mo), manganese (Mn), palladium (Pd), silver (Ag), or copper (Cu), or an alloy containing at least one metal material selected from these metals, or the like. Further, the electrode pads 3, the via conductor 5, the first electrical conductor layer 6, the second electrical conductor layer 7, the external circuit connection electrode, the electrode, the internal wiring electrical conductors, and/or the through-hole conductors may contain only copper (Cu). When the substrate 2 is made of a resin, the electrode pads 3, the via conductor 5, the first electrical conductor layer 6, the second electrical conductor layer 7, the external circuit connection electrode, the internal wiring electrical conductors, and/or the through-hole conductors contain copper (Cu), gold (Au), aluminum (Al), nickel (Ni), molybdenum (Mo), palladium (Pd), or titanium (Ti), or an alloy containing at least one metal material selected from these metals, or the like.

A plating layer may be further provided on the exposed surface of the electrode pads 3, the via conductor 5, the external circuit connection electrode, the electrode, the internal wiring electrical conductor, and/or the through-hole conductors. According to this configuration, oxidation can be suppressed by protecting the exposed surfaces of the external circuit connection electrode, the electrical conductor layer, and the through-hole conductors. In addition, according to this configuration, the electrode pad 3 and the electronic element 10 can be favorably electrically connected via an electronic element bonding member 13 such as wire bonding. The plating layer may be formed by depositing a nickel (Ni) plating layer having a thickness of from 0.5 µm to 10 µm, or by sequentially depositing the nickel plating layer and a gold (Au) plating layer having a thickness of from 0.5 µm to 3 µm.

In a plan perspective, the first electrical conductor layer 6 includes the first land portion 6a surrounding the via conductor 5, the first clearance portion 6c surrounding the first land portion 6a and being electrically insulated, and the first peripheral portion 6b surrounding the first clearance portion 6c. Here, the first land portion 6a and the first peripheral portion 6b of the first electrical conductor layer 6 may be for the same signal or for different signals. Further, the first peripheral portion 6b may be, for example, a wide solid pattern or a thin wire shape signal pattern.

In a plan perspective, the second electrical conductor layer 7 includes the second land portion 7a surrounding the via conductor 5, the second clearance portion 7c surrounding the second land portion 7a, and the second peripheral portion 7b surrounding the second clearance portion 7c and electrically insulated from the second land portion 7a with the second clearance portion 7c interposed between the second land portion 7a and the second peripheral portion 7b. Here, the second land portion 7a and the second peripheral portion 7b of the second electrical conductor layer 7 may be for the same signal or for different signals. Further, the second peripheral portion 7b may be, for example, a wide solid pattern or a thin wire shape signal pattern.

Furthermore, the first electrical conductor layer 6 and the second electrical conductor layer 7 may be for the same signal or for different signals.

The substrate 2 has the first portion 6e in which the first land portion 6a overlaps the second land portion 7a in a plan perspective, and the second portion 6f in which the first clearance portion 6c does not overlap the second clearance portion 7c in a plan perspective. The first peripheral portion 6b and the second peripheral portion 7b of the substrate 2 each have an end portion (first end portion 6d and second end portion 7d) that becomes thinner as the distance from the via conductor 5 increases in a vertical cross-sectional view.

In recent years, electronic devices have been required to be thinner. Therefore, the respective insulating layers of the electronic element mounting substrate used in the electronic device have been also required to be thinner. In order to increase the conductivity of the through-hole conductor of the electronic element mounting substrate, a land pattern is provided on the front surface and/or the lower surface of each insulating layer. To improve the insulating property from a pattern connected to another potential in the same layer, a clearance may be provided between this land pattern and the pattern connected to the other potential. In this case, when some or all of the plurality of through-hole conductors overlap in a top view, these clearances may partially or wholly overlap in a top view. When the respective insulating layers of the electronic element mounting substrate are made thinner, a plurality of these clearances overlap in a top view, thereby causing unevenness on the surface of the electronic element mounting substrate. Alternatively, a space may be formed around the edge of the clearance inside the electronic element mounting substrate. This raises a concern about reduced strength or cracking of the electronic element mounting substrate.

In contrast, the electronic element mounting substrate 1 according to the present embodiment has the second portion 6f in which the first clearance portion 6c does not overlap the second clearance portion 7c in a plan perspective. With this configuration, it is possible to reduce the occurrence of unevenness on the surface of the electronic element mounting substrate 1 due to the overlapping of the plurality of the clearances.

Further, in general, in the electronic element mounting substrate, the respective insulating layers are deformed to absorb the thickness of the wiring layer provided between the insulating layers, and the periphery of the wiring layer is covered with the insulating layers. However, when the respective insulating layers become thinner due to the thinning of the electronic element mounting substrate, a space may be generated between the wiring layer and the insulating layer. The generation and the overlap of a plurality of spaces raise a concern that the strength of the electronic element mounting substrate is reduced.

In contrast, in the electronic element mounting substrate 1 according to the present embodiment, the thicknesses of the first end portion 6d of the first peripheral portion 6b and the second end portion 7d of the second peripheral portion 7b of the substrate 2 become thinner as the distance from the via conductor 5 increases in a vertical cross-sectional view. That is, the peripheral portions each have the end portion (first end portion 6d and second end portion 7d) that becomes thinner as the distance from the via conductor 5 increases. In particular, the first peripheral portion 6b and the second peripheral portion 7b may have a curved lens shape in which both ends thereof become thinner toward the ends in a cross-sectional view. That is, the first end portion 6d and the second end portion 7d may be lenticular in a cross-sectional view. As a result, even when the respective insulating layers of the electronic element mounting substrate 1 are thinner, the end portions of the first peripheral portion 6b and the second peripheral portion 7b form curved portions, so that the respective insulating layers are easily deformed along the end portions of the first electrical conductor layer 6 and the second electrical conductor layer 7. Thus, it is possible to reduce the generation of a space between the wiring layer and the insulating layer, which makes it possible to reduce the decrease in strength of the electronic element mounting substrate.

The substrate 2 may have a frame body on an upper surface thereof. Further, the frame body may be made of a material similar to or different from that of the substrate 2. The substrate 2 and the frame body may be joined by a bonding material, or may be bonded by simultaneous sintering when the substrate 2 and the frame body are made of insulating ceramics. Additionally, the frame body may have a step and have the electrode pads 3 thereon, and in this case, the substrate 2 and the frame body may be electrically connected to each other.

As illustrated in the examples in FIGS. 1 to 6, in the substrate 2, further, outer ends of the first land portion 6a and the second land portion 7a, that is, end portions located in a direction away from the via conductor 5, may also have curved portions on the upper surface and the lower surface. Due to this structure, even when the respective insulating layers of the electronic element mounting substrate 1 are thinner, the end portions of the first land portion 6a and the second land portion 7a form the curved portions, so that the respective insulating layers are easily deformed along the end portions of the first electrical conductor layer 6 and the second electrical conductor layer 7. Thus, it is possible to reduce the generation of a space between the wiring layer and the insulating layer, which makes it possible to reduce the decrease in strength of the electronic element mounting substrate.

As illustrated in the examples in FIGS. 1 to 6, the respective outer ends of the first peripheral portion 6b and the second peripheral portion 7b, that is, the end portions located in the direction away from the via conductor 5, may be curved in a vertical cross-sectional view. In other words, the respective upper surfaces and lower surfaces of the first end portion 6d and the second end portion 7d may have curved portions. As a result, even when the respective insulating layers of the electronic element mounting substrate 1 are thinner, the outer ends of the first peripheral portion 6b and the second peripheral portion 7b are curved, so that the respective insulating layers are easily deformed along the outer ends of the first electrical conductor layer 6 and the second electrical conductor layer 7. Thus, it is possible to reduce the generation of a space between the wiring layer and the insulating layer, which makes it possible to reduce the decrease in strength of the electronic element mounting substrate. Further, for example, when the respective outer ends are located near the outer peripheral portion of the substrate 2, the outer end of each of the first peripheral portion 6b and the second peripheral portion 7b are curved vertically so that the respective insulating layers are easily deformed along the outer ends of the first electrical conductor layer 6 and the second electrical conductor layer 7. Therefore, it is possible to reduce the occurrence of poor adhesion between the insulating layers at the outer peripheral portion of the substrate 2 during the manufacturing process.

FIGS. 3 to 6 illustrate enlarged cross-sectional views of the main part A of the present embodiment.

Figure 3:
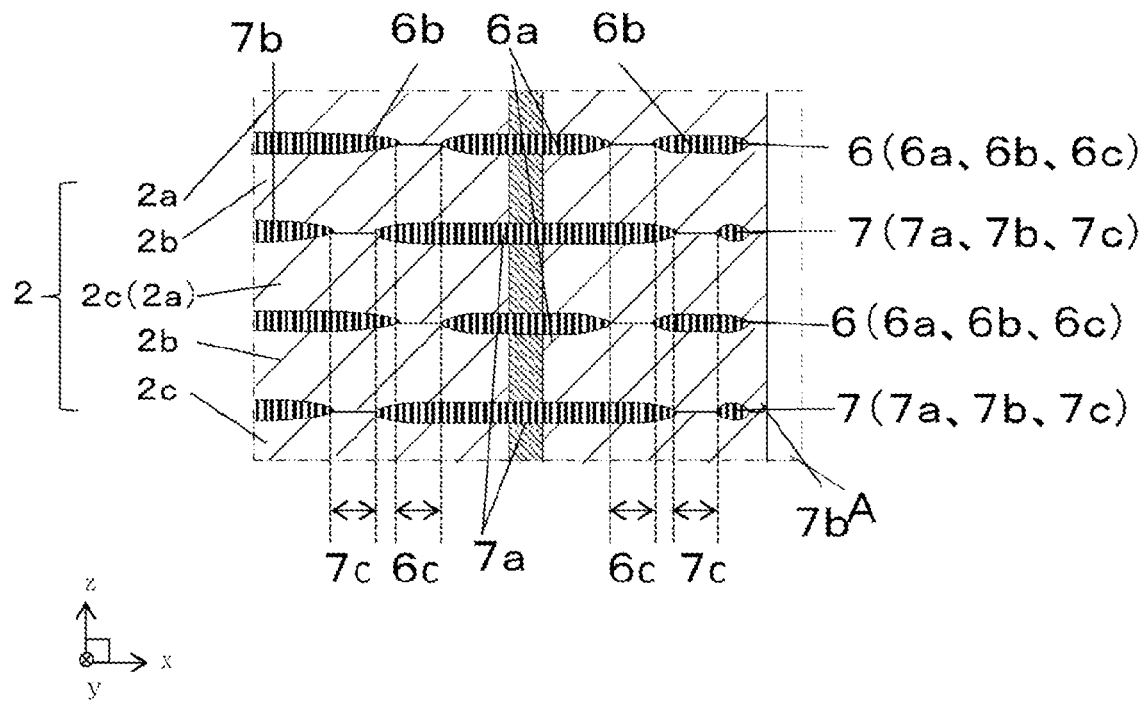
FIG. 3 is an enlarged vertical sectional view of a main part A of an electronic element mounting substrate according to another aspect of the first embodiment of the present disclosure.

In the example illustrated in FIG. 3, in the electronic element mounting substrate 1, the second clearance portion 7c overlaps the first peripheral portion 6b in a plan perspective. This makes it possible to reduce the overlap between the first clearance portion 6c and the second clearance portion 7c in a plan perspective. Therefore, it is possible to reduce the occurrence of unevenness on the surface of the electronic element mounting substrate 1. In addition, the second clearance portion 7c overlaps the first peripheral portion 6b in a plan perspective, so that the portion where the second clearance portion 7c is located can be reinforced. Therefore, it is possible to reduce the decrease in strength of the electronic element mounting substrate. Note that in this case, the second clearance portion 7c may completely overlap or only part thereof may overlap the first peripheral portion 6b in a plan perspective. In particular, when the second clearance portion 7c completely overlaps the first peripheral portion 6b in a plan perspective, the effect of reinforcement can be further improved.

Figure 4:
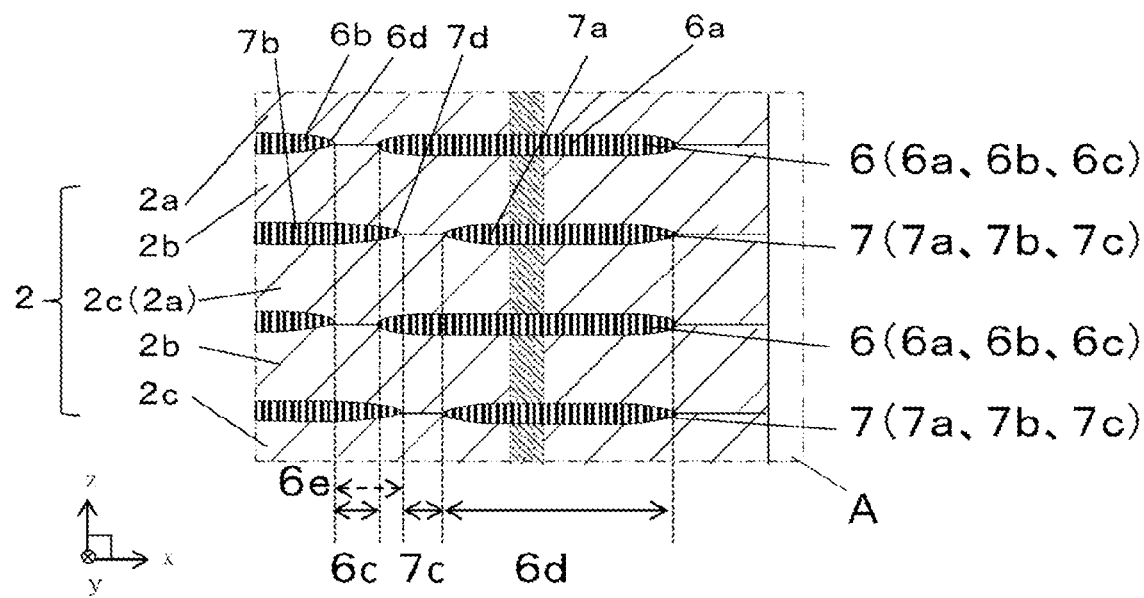
FIG. 4 is an enlarged vertical sectional view of a main part A of an electronic element mounting substrate according to another aspect of the first embodiment of the present disclosure.

In the example illustrated in FIG. 4, in the electronic element mounting substrate 1, the first clearance portion 6c overlaps the second peripheral portion 7b in a plan perspective. This makes it possible to reduce the overlap between the first clearance portion 6c and the second clearance portion 7c in a plan perspective. Therefore, it is possible to reduce the occurrence of unevenness on the surface of the electronic element mounting substrate 1. In addition, the first clearance portion 6c overlaps the second peripheral portion 7b in a plan perspective so that the portion where the first clearance portion 6c is located can be reinforced. Therefore, it is possible to reduce the decrease in strength of the electronic element mounting substrate. Note that in this case, the first clearance portion 6c may completely overlap or only part thereof may overlap the second peripheral portion 7b in a plan perspective. In particular, when the first clearance portion 6c completely overlaps the second peripheral portion 7b in a plan perspective, the effect of reinforcement can be further improved.

Further, in the first electrical conductor layer 6 and/or the second electrical conductor layer 7, the first peripheral portion 6b and/or the second peripheral portion 7b may be located so as to surround the periphery of the first land portion 6a and/or the second land portion 7a, as in the example illustrated in FIG. 3, or the first peripheral portion 6b and/or the second peripheral portion 7b may only be located in a part of the vicinity of the first land portion 6a and/or the second land portion 7a, as in the example illustrated in FIG. 4. In either case, the effect of the present embodiment can be obtained. Further, as illustrated in the example in FIG. 4, the first peripheral portion 6b and/or the second peripheral portion 7b are not located between the outer edge of the substrate 2 and the first land portion 6a and/or the second land portion 7a. As a result, when the substrate 2 is made of an insulating ceramic, the pressure can be uniformly applied to the outer peripheral part of the substrate 2 in the layering step, so that it is possible to reduce the occurrence of poor adhesion between the insulating layers on the outer edge portion of the substrate 2 during the manufacturing process.

Figure 5:
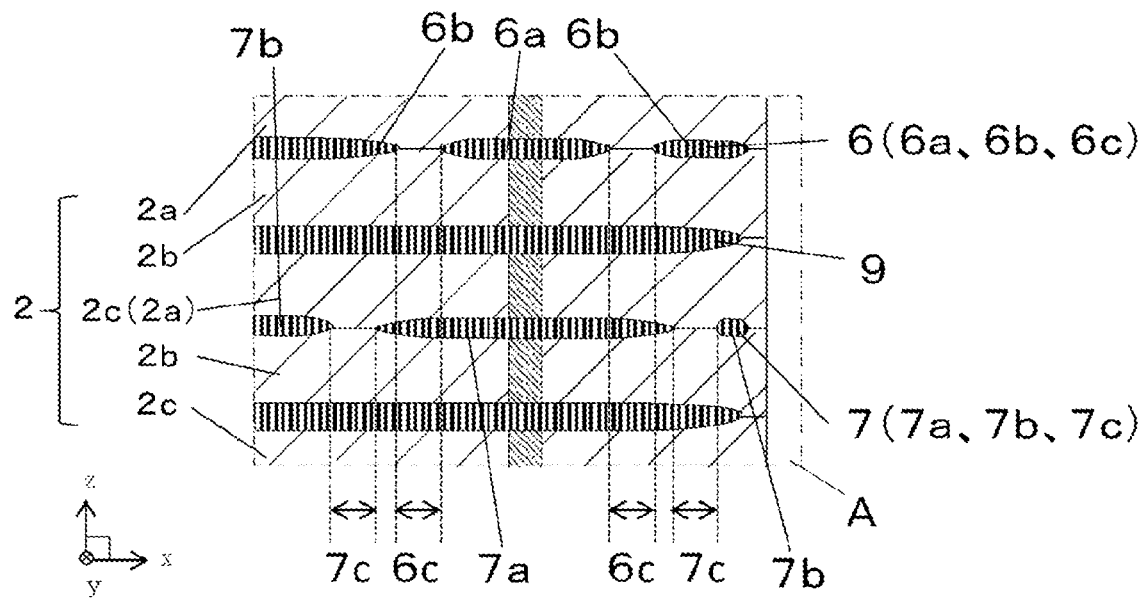
FIG. 5 is an enlarged vertical sectional view of a main part A of an electronic element mounting substrate according to another aspect of the first embodiment of the present disclosure.

In the example illustrated in FIG. 5, the electronic element mounting substrate 1 includes another electrical conductor layer 9 between the first electrical conductor layer 6 and the second electrical conductor layer 7 in a cross-sectional view. In such a case as well, it is possible to reduce the overlap between the first clearance portion 6c and the second clearance portion 7c in a plan perspective. Further, by locating the other electrical conductor layer 9 between the first electrical conductor layer 6 and the second electrical conductor layer 7, it is possible to reduce the occurrence of unevenness on the surface of the electronic element mounting substrate 1 even when the first clearance portion 6c and the second clearance portion 7c partially overlap in a plan perspective. Alternatively, it is possible to reduce the decrease in strength or the occurrence of cracks in the electronic element mounting substrate 1 caused by the creation of a space around the edge of the clearance inside the electronic element mounting substrate 1. Additionally, the portion where the first clearance portion 6c and the second clearance portion 7c are located can be reinforced with the other electrical conductor layer 9, and it is possible to reduce the decrease in strength of the electronic element mounting substrate.

Figure 6:
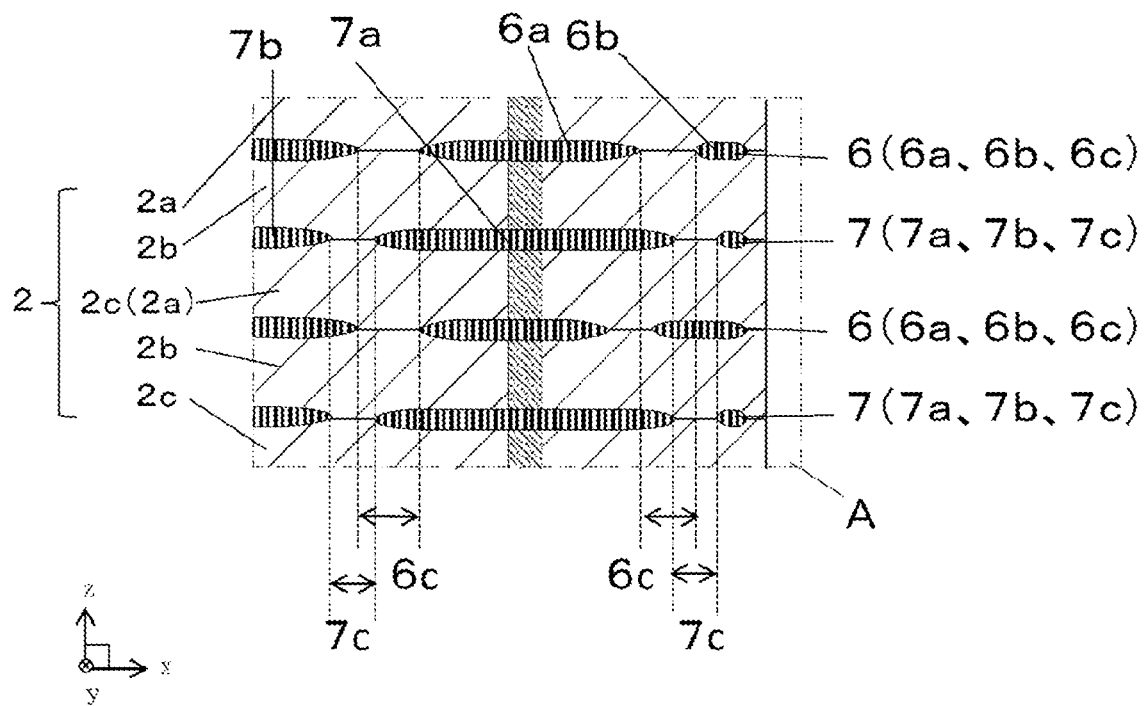
FIG. 6 is an enlarged vertical sectional view of a main part A of an electronic element mounting substrate according to another aspect of the first embodiment of the present disclosure.

In the example illustrated in FIG. 6, in the electronic element mounting substrate 1, the first clearance portion 6c overlaps the second land portion 7a in a plan perspective. In such a case as well, the effect of the present embodiment can be obtained. In addition, the first clearance portion 6c overlaps the second land portion 7a in a plan perspective so that the portion where the first clearance portion 6c is located can be reinforced. Therefore, it is possible to reduce the decrease in strength of the electronic element mounting substrate. Note that in this case, the first clearance portion 6c may completely overlap or only part thereof may overlap the second land portion 7a in a plan perspective. In particular, when the first clearance portion 6c completely overlaps the first land portion 7a in a plan perspective, the effect of reinforcement can be further improved.

Figure 7:
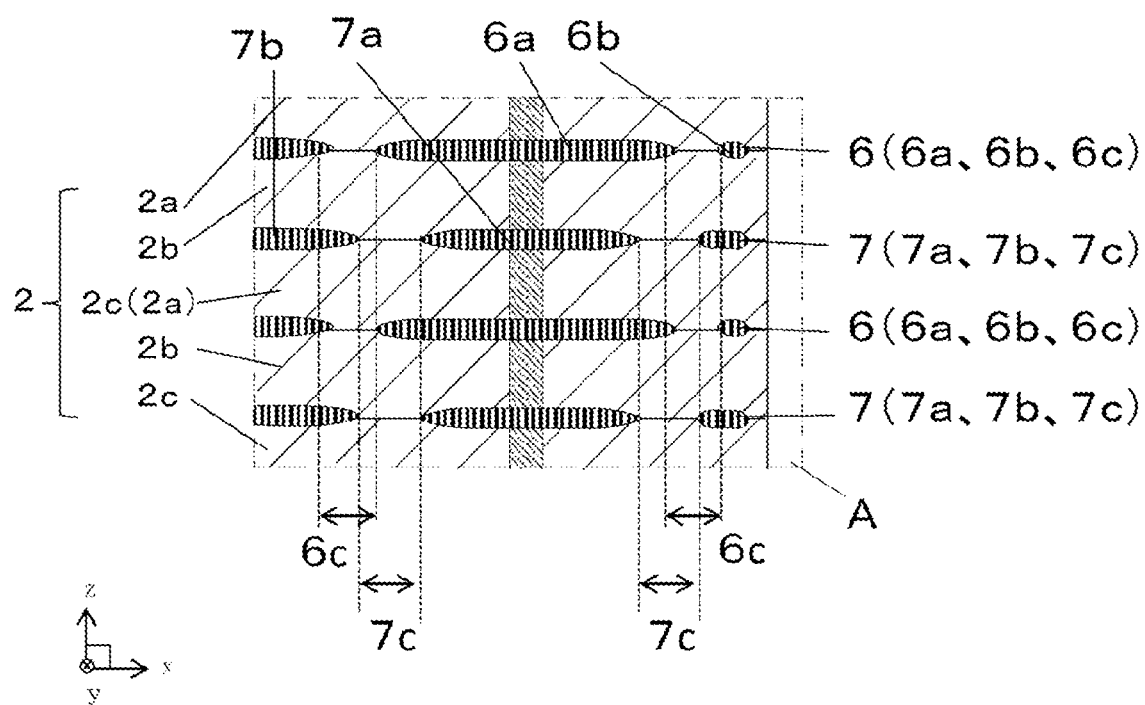
FIG. 7 is an enlarged vertical sectional view of a main part A of an electronic element mounting substrate according to another aspect of the first embodiment of the present disclosure.

In the example illustrated in FIG. 7, in the electronic element mounting substrate 1, the second clearance portion 7c overlaps the first land portion 6a in a plan perspective. In such a case as well, the effect of the present embodiment can be obtained. In addition, the second clearance portion 7c overlaps the first land portion 6a in a plan perspective, so that the portion where the second clearance portion 7c is located can be reinforced. Therefore, it is possible to reduce the decrease in strength of the electronic element mounting substrate. Note that in this case, the second clearance portion 7c may completely overlap or only part thereof may overlap the first land portion 6a in a plan perspective. In particular, when the second clearance portion 7c completely overlaps the second land portion 6a in a plan perspective, the effect of reinforcement can be further improved.

Figure 8A:
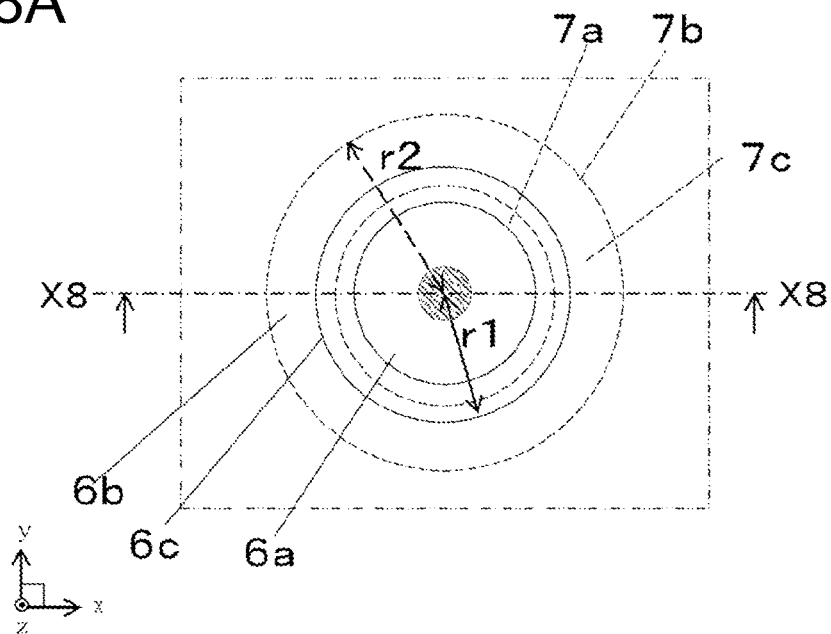
FIG. 8A is an enlarged plan perspective of a main part A of an electronic element mounting substrate according to another aspect of the first embodiment of the present disclosure.
Figure 8B:
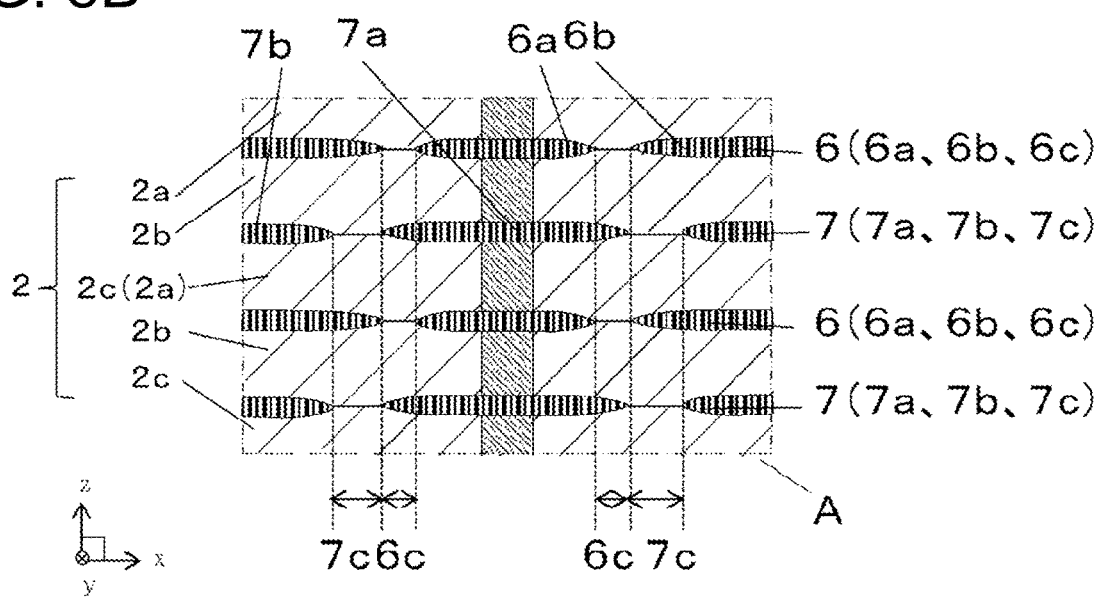
FIG. 8B is a vertical sectional view corresponding to line X8-X8 in FIG. 8A.
Figure 9A:
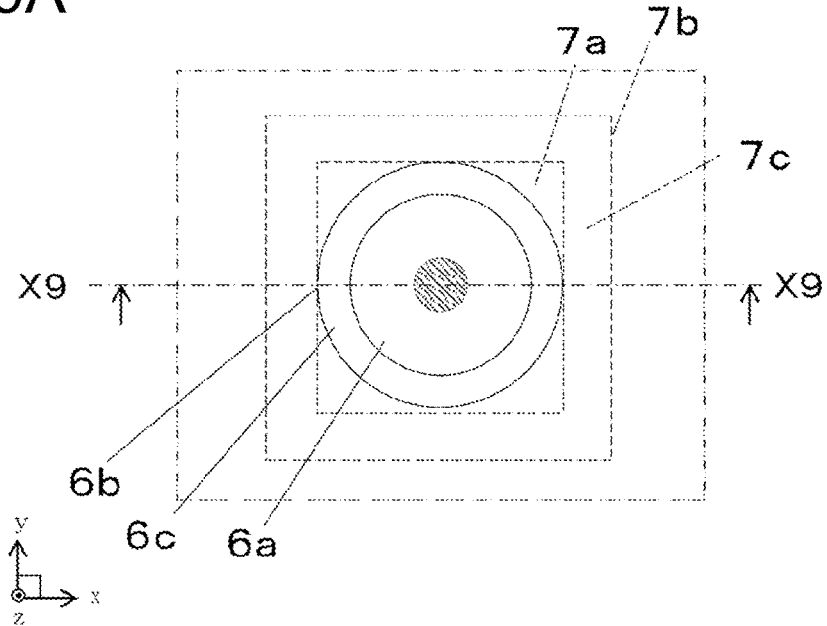
FIG. 9A is an enlarged plan perspective of a main part A of an electronic element mounting substrate according to another aspect of the first embodiment of the present disclosure.
Figure 9B:
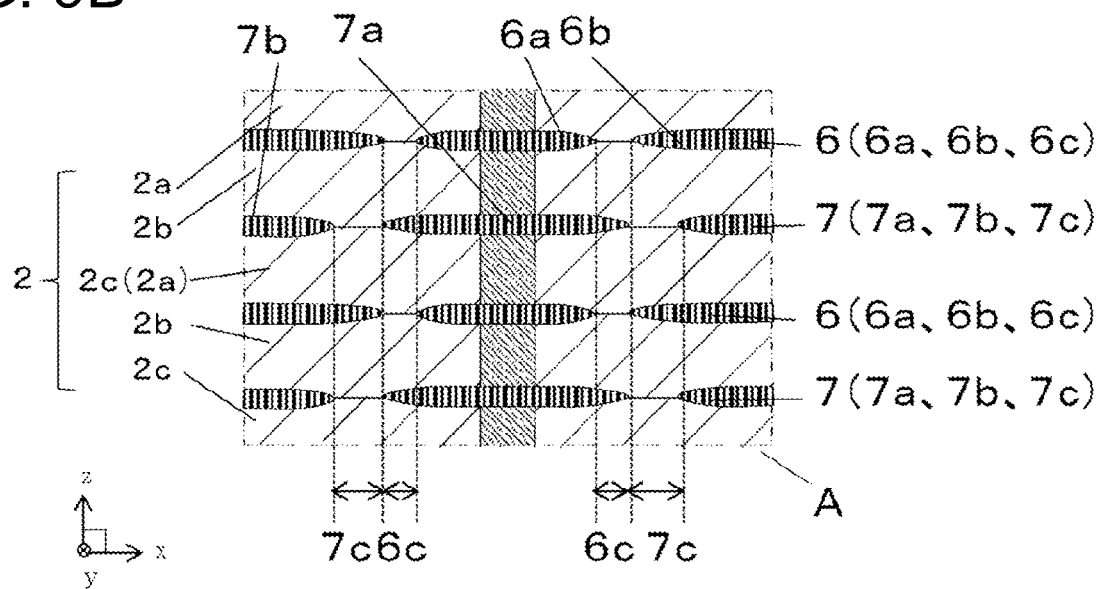
FIG. 9B is a vertical cross-sectional view corresponding to line X9-X9 in FIG. 9A.

FIGS. 8 to 9 illustrate enlarged plan perspectives and enlarged cross-sectional views of the main part A of the present embodiment. Note that FIGS. 8A and 9A are views taken from the first electrical conductor layer 6 in a plan perspective.

In the example illustrated in FIG. 8, the first land portion 6a and the second land portion 7a have the same shape in a plan perspective, but the sizes of the first land portion 6a and the second land portion 7a are different. For example, in a plan perspective, when the direction away from the center of the via conductor 5 is toward the outside, and the outer edges of the first land portion 6a and the second land portion 7a have circular shapes, the radii of the first land portion 6a and the second land portion 7a are different. Additionally, in a plan perspective, when the direction away from the center of the via conductor 5 is toward the outside, the outer edges of the first clearance portion 6c and the second clearance portion 7c may have circular shapes and the radii of the first clearance portion 6c and the second clearance portion 7c are different. In this case, the size of the outer edge of the first clearance portion 6c in a plan perspective is a first radius r1, and the size of the outer edge of the second clearance portion 7c is a second radius r2. The first radius r1 may be larger or smaller than the second radius r2. The second radius r2 may be different from the first radius r1. Further, in the example illustrated in FIG. 9, the first land portion 6a and the second land portion 7a have different shapes in a plan perspective. In either case, it is possible to reduce the possibility that the first clearance portion 6c and the second clearance portion 7c completely overlap with each other in a plan perspective. As a result, it is possible to reduce the occurrence of unevenness on the surface of the electronic element mounting substrate 1 due to the respective insulating layers entering the first clearance portion 6c and the second clearance portion 7c by overlapping the first clearance portion 6c and the second clearance portion 7c in a plan perspective.

In the example illustrated in FIG. 9, the first land portion 6a has a circular shape and the second land portion 7a has a rectangular shape. As a result, even when the shape is slightly deformed due to an error or the like during manufacturing, the possibility that the first land portion 6a and the second land portion 7a have exactly the same shape can be reduced. Therefore, the effect of the present embodiment can be obtained even when a manufacturing error occurs. Further, it is possible to reduce the possibility of having the same shape due to a manufacturing error or the like, so that the first land portion 6a and the second land portion 7a can be made to have similar sizes. Thus, the electronic element mounting substrate 1 can be decreased in size. Here, in the combination of the first land portion 6a and the second land portion 7a, the respective shapes are a circle and a rectangle. However, the respective shapes may be a circle and a triangle, a triangle and a rectangle, or polygonal shapes that are different.

Configuration of Electronic Device

An example of the electronic device 21 is illustrated in FIG. 1. The electronic device 21 includes the electronic element mounting substrate 1 and the electronic element 10 mounted on the upper surface of the electronic element mounting substrate 1.

The electronic device 21 includes the electronic element mounting substrate 1 and the electronic element 10 mounted on the mounting region of the substrate 2 of the electronic element mounting substrate 1. Examples of the electronic element 10 include, for example, an imaging element such as a charge coupled device (CCD) or a complementary metal oxide semiconductor (CMOS), a light emitting element such as a light emitting diode (LED), an element having a sensor function such as pressure, air pressure, acceleration, a gyroscope, or the like, and an integrated circuit. Note that the electronic element 10 may be disposed on the upper surface of the substrate 2 with an adhesive interposed therebetween. Examples of the adhesive include a silver epoxy and a thermosetting resin.

The electronic element 10 and the electronic element mounting substrate 1 may be electrically connected by, for example, the electronic element bonding member 13.

The electronic device 21 may include a lid 12 bonded to the upper surface of the electronic element mounting substrate 1 and covering the electronic element 10.

For example, when the electronic element 10 is an imaging element such as a CMOS or a CCD, or a light emitting element such as an LED, a material having high transparency such as a glass material may be used for the lid. Further, for example, when the electronic element 10 is an integrated circuit or the like, a metal material, a ceramic material, or an organic material may be used for the lid.

The lid may be bonded to the electronic element mounting substrate 1 with a lid bonding member 14 interposed therebetween. Examples of materials for the lid bonding member 14 may include a thermosetting resin, a low melting point glass, and a brazing material made of a metal component.

When the electronic device 21 has the electronic element mounting substrate 1 as illustrated in FIGS. 1 to 3, it is possible to reduce the surface unevenness and/or lessen reduction in strength of the electronic element mounting substrate 1. Therefore, it is possible to improve the manufacturing yield of the electronic device 21.

Configuration of Electronic Module

An example of the electronic module 31 is illustrated in FIG. 2. The electronic module 31 includes the electronic device 21 and a casing 32 located on an upper surface thereof.

The electronic element mounting substrate 1 and the electronic device 21 according to the present embodiment may constitute an electronic module 31 including the electronic device 21 and the casing 32 located on the upper surface of the electronic device 21 or over the electronic device 21. Note that, in the examples described below, an imaging module is described as an example. Here, as to the casing 32 located on the upper surface of the electronic device 21, a case where the electronic device 21 itself is covered by the casing 32 is included in the present configuration because a portion of the casing 32 is located over the electronic device 21.

The electronic module 31 may include the casing 32 (e.g., a lens holder). The inclusion of the casing 32 makes it possible to further improve airtightness or reduce the direct application of stress from the outside of the electronic device 21 to the electronic device 21. The casing 32 is made of, for example, a resin or a metal material. When the casing 32 is a lens holder, one or more lenses made of a resin, a liquid, a glass, a crystal, or the like may be incorporated into the casing 32. In addition, the casing 32 may be equipped with a drive device or the like configured to drive up, down, left, and right, and may be electrically connected to a pad or the like located on the surface of the electronic element mounting substrate 1 via a bonding member such as solder.

Note that the casing 32, when viewed from directly above, may be provided with an opening portion on at least one side in any of four directions or on the lower surface side. Further, an external circuit board may be inserted through the opening portion of the casing 32 and electrically connected to the electronic element mounting substrate 1. In addition, after the external circuit board has been electrically connected to the electronic element mounting substrate 1, the opening portion of the casing 32 may be sealed with a sealing material such as a resin or the like, such that the inside of the electronic module 31 may be hermetically sealed.

Method of Manufacturing Electronic Element Mounting Substrate and Electronic Device Next, an example of a method of manufacturing the electronic element mounting substrate 1 and the electronic device 21 according to the present embodiment will be described. Note that as the example of the manufacturing method, a method of manufacturing the base 2 using a multipiece wiring board will be described below.

(1) First, ceramic green sheets that constitute the base 2 are formed. For example, in order to obtain the base 2 made of an aluminum oxide ($Al_2O_3$) sintered compact, a powder of, for example, silica ($SiO_2$), magnesia (MgO), or calcia (CaO) is added as a sintering aid to $Al_2O_3$ powder. Further, a suitable binder, a solvent, and a plasticizer are added, and then a mixture thereof is kneaded to form a slurry. Then, multipiece ceramic green sheets are obtained by a formation method, such as a doctor blade method or a calender roll method.

Note that when the base 2 is made of a resin, for example, the base 2 can be formed by a transfer molding method, an injection molding method, pressing with a metal mold, or the like using a metal mold capable of forming the resin into a predetermined shape. Further, the material of the base 2 may be a base material made of glass fibers impregnated with a resin, such as a glass epoxy resin. In this case, the base 2 can be formed by impregnating a base material made of glass fibers with an epoxy resin precursor and thermally curing the epoxy resin precursor at a predetermined temperature.

(2) Subsequently, the aforementioned green sheets are processed using a metal mold or the like. Here, when the base 2 has a cutout section or the like, the cutout section or the like may be similarly formed at a predetermined portion of the green sheet to be the base 2.

(3) Subsequently, the ceramic green sheets to be respective insulating layers of the base 2 are layered and placed under pressure. In this way, the ceramic green sheets to be insulating layers are layered to produce a ceramic green sheet laminated body to be the base 2 (the electronic element mounting substrate 1). Note that at this time, a portion to be the cutout section or the like may be appropriately produced by a metal mold or the like.

(4) Subsequently, by a screen printing method or the like, a metal paste is applied to or filled in portions of the ceramic green sheets or the ceramic green sheet laminated body that become the electrode pads 3, the external circuit connection electrode, the internal wiring electrical conductor, and the internal through-hole conductor. Note that the metal paste may be applied to or filled in before the step of layering the ceramic green sheets. This metal paste is created so as to have appropriate viscosity by adding a suitable solvent and binder to the metal powder formed of the above-described metal materials, and kneading the mixture. Note that a glass or a ceramic may also be contained in the metal paste in order to increase the bonding strength with the base 2.

Further, when the base 2 is made of a resin, the electrode pads 3, the external circuit connection electrode, the internal wiring electrical conductors, and the through-hole conductors can be manufactured by sputtering, vaporizing, or the like. Furthermore, when the base 2 is made of a resin, the electrode pads 3, the external circuit connection electrode, the internal wiring conductors, and the through-hole conductors may be manufactured by using a plating method after providing a metal film on the surface.

In this step, the first electrical conductor layer 6 and the second electrical conductor layer 7 may be produced by the method described above.

(5) Subsequently, split grooves are provided at predetermined positions on the green sheet by using a metal mold, punching, a laser, or the like. Note that the split grooves can be formed by notching the multipiece wiring board shallower than the thickness thereof using a slicing device after firing. Alternatively, the split grooves may be formed by pressing a cutter blade against the ceramic green sheet laminated body for the multipiece wiring board, or by notching the ceramic green sheet laminated body shallower than the thickness thereof using a slicing device. Note that in this step, a plurality of holes 6 may be formed by pressing with a metal mold or the like, for example.

(6) Subsequently, the ceramic green sheet laminated body is fired at a temperature of from approximately 1500° C. to approximately 1800° C. to obtain the multipiece wiring board in which a plurality of the bases 2 (the electronic element mounting substrates 1) are arrayed. Note that, in this step, the above-described metal paste is fired at the same time as the ceramic green sheets forming the base 2 (the electronic element mounting substrate 1), and forms the electrode pads 3, the external circuit connection electrode, the internal wiring electrical conductor, and the through-hole conductor.

(7) Subsequently, the multipiece wiring board obtained by the firing is divided into a plurality of bases 2 (the electronic element mounting substrates 1). In this division, there is a method of dividing the multipiece wiring board into the plurality of bases 2 by breaking along the split grooves that are formed on the multipiece wiring board along the portions becoming the outer edges of the bases 2 (the electronic element mounting substrates 1) in step (5). Further, there is also a method in which the multipiece wiring board is cut, by slicing or the like, along the locations that will serve as the outer edges of the bases 2 (electronic element mounting substrates 1) without performing step (5). Note that, before or after dividing the multipiece wiring board described above into the plurality of bases 2 (electronic element mounting substrates 1), the plating may be applied to the electrode pads 3, the external connection pad, and the exposed wiring conductors using an electrolytic or electroless plating method, respectively.

(8) Subsequently, the electronic element 10 is mounted on the electronic element mounting substrate 1. The electronic element 10 is electrically connected to the electronic element mounting substrate 1 with the electronic element bonding members 13. At this time, an adhesive or the like may be provided on the electronic element 10 or the electronic element mounting substrate 1 to fix the electronic element 10 to the electronic element mounting substrate 1.

The electronic device 21 can be manufactured by manufacturing the electronic element mounting substrate 1 as described in steps (1) to (7) and mounting the electronic element 10 on the electronic element mounting substrate 1. Note that the order of the above-described steps (1) to (8) can be changed to another order in which the process can be performed. In addition to the process described above, the electronic element mounting substrate 1 can also be manufactured by using, for example, a 3D printer or the like.

Second Embodiment

The electronic element mounting substrate 1 according to a second embodiment of the present disclosure will be described next with reference to FIG. 10.

The electronic element mounting substrate 1 according to the present embodiment is different from the electronic element mounting substrate 1 according to the first embodiment in that another insulating layer 2d is provided between the first electrical conductor layer 6 and the second electrical conductor layer 7, and that the first clearance portion 6c and the second clearance portion 7c do not overlap in a plan perspective.

Figure 10:
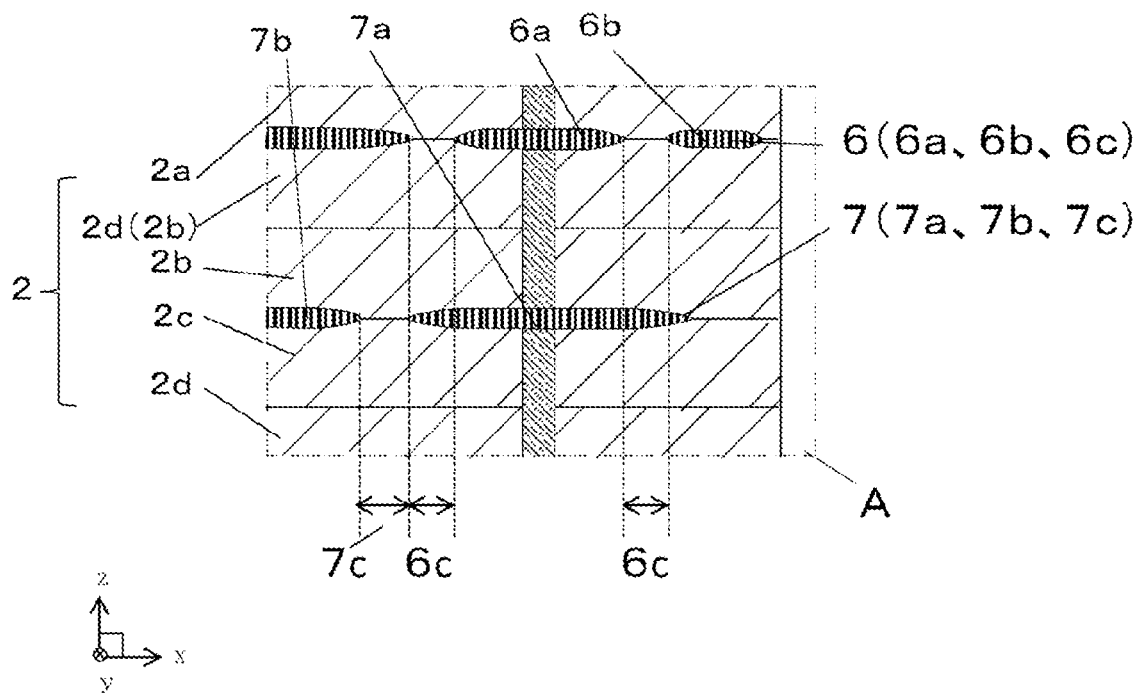
FIG. 10 is an enlarged vertical sectional view of a main part A of an electronic element mounting substrate according to a second embodiment of the present disclosure.

In the example illustrated in FIG. 10, the substrate 2 of the electronic element mounting substrate 1 has the other insulating layer 2d between the first layer 2a and the second layer 2b, and the second electrical conductor layer 7 is located between the other insulating layer 2d and the second layer 2b. In other words, the other insulating layer 2d is further added between the first electrical conductor layer 6 and the second electrical conductor layer 7. In such a case as well, the first electrical conductor layer 6 and the second electrical conductor layer 7 have portions where the first clearance portion 6c and the second clearance portion 7c do not overlap in a plan perspective, and the thicknesses of the first peripheral portion 6b and the second peripheral portion 7b of the substrate 2 become thinner toward the edges. Therefore, it is possible to reduce the occurrence of unevenness on the surface of the electronic element mounting substrate 1. Further, it is possible to reduce the generation of a space between the wiring layer and the insulating layer, which makes it possible to reduce the decrease in strength of the electronic element mounting substrate. Furthermore, by further having the other insulating layer 2d between the first electrical conductor layer 6 and the second electrical conductor layer 7, it is possible to further reduce the occurrence of a space between the wiring layer and the insulating layer, which makes it possible to reduce the decrease in strength of the electronic element mounting substrate.

In the example illustrated in FIG. 10, the first clearance portion 6c and the second clearance portion 7c of the electronic element mounting substrate 1 are located apart from each other (not overlapping) in a plan perspective. In such a case as well, the effect of the present embodiment can be obtained. Further, the first clearance portion 6c and the second clearance portion 7c are located apart from each other, which makes it possible to further reduce the decrease in strength of the substrate 2 and the occurrence of surface unevenness. Note that in this case, the first clearance portion 6c and the second clearance portion 7c may be located at a distance, or the respective edges may overlap each other in a plan perspective. Since the first clearance portion 6c and the second clearance portion 7c are located at a distance, even when a process error or the like occurs, the amount of overlap between the first clearance portion 6c and the second clearance portion 7c can be reduced, and thus it is possible to reduce the decrease in strength of the substrate 2. In addition, when the edges of the first clearance portion 6c and the second clearance portion 7c overlap in a plan perspective, the size of the electronic element mounting substrate 1 can be reduced while obtaining the effect of the present embodiment.

Third Embodiment

The electronic element mounting substrate 1 according to a third embodiment of the present disclosure will be described next with reference to FIG. 11.

The electronic element mounting substrate 1 according to the present embodiment is different from the electronic element mounting substrate 1 according to the first embodiment in that the substrate 2 has a third electrical conductor layer 8, and the first clearance portion 6c, the second clearance portion 7c, and a third clearance portion 8c are located apart from each other in a plan perspective.

Figure 11:
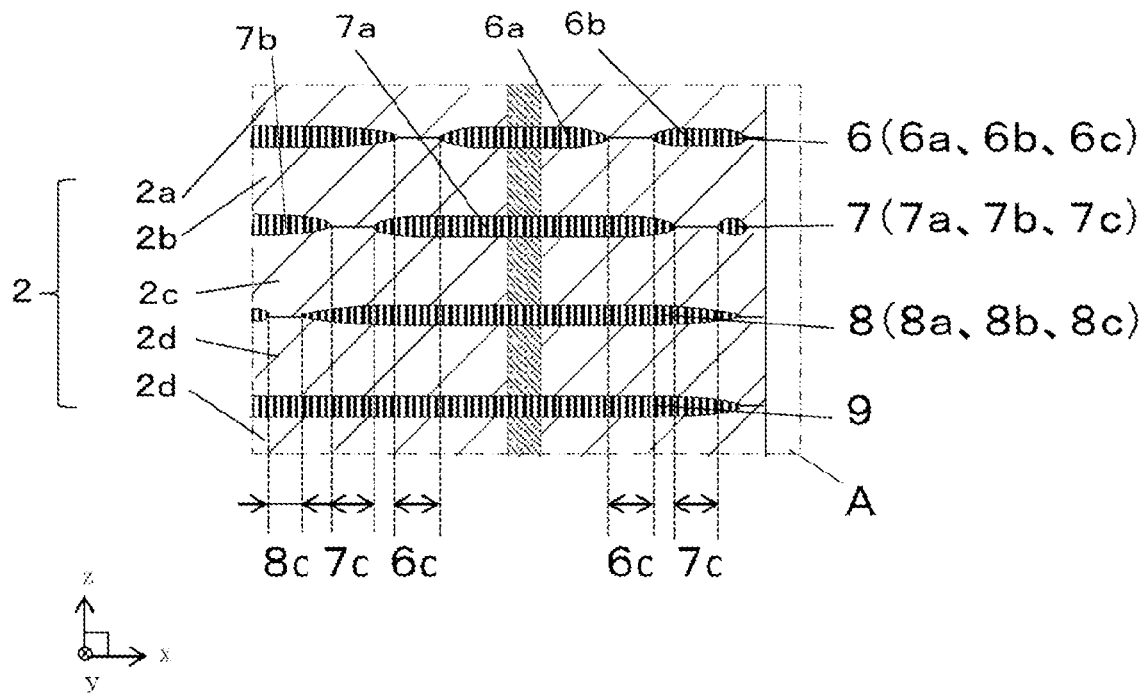
FIG. 11 is an enlarged vertical sectional view of a main part A of an electronic element mounting substrate according to a third embodiment of the present disclosure.

In the example illustrated in FIG. 11, the substrate 2 includes the third electrical conductor layer 8, and the first clearance portion 6c, the second clearance portion 7c, and the third clearance portion 8c are located apart from each other in a plan perspective. Here, similar to the first electrical conductor layer 6 and the second electrical conductor layer 7, the third electrical conductor layer 8 includes a third land portion 8a surrounding the via conductor 5, the third clearance portion 8c surrounding the third land portion 8a and electrically isolated, and a third peripheral portion 8b surrounding the third clearance portion 8c. In such a case as well, the first clearance portion 6c, the second clearance portion 7c, and the third clearance portion 8c do not overlap, so that it is possible to reduce the occurrence of unevenness on the surface of the electronic element mounting substrate 1. In the example illustrated in FIG. 11, each clearance portion overlaps the land portion of a corresponding electrical conductor layer in a plan perspective. This allows each clearance portion to be reinforced by a corresponding land portion. Therefore, it is possible to reduce the decrease in strength of the electronic element mounting substrate.

In the example illustrated in FIG. 11, the third peripheral portion 8b and the third land portion 8a of the third electrical conductor layer 8 may have end portions that become thinner toward the end, that is, as the distance from the via conductor 5 increases. These end portions may have curved portions. Due to this structure, even when the respective insulating layers of the electronic element mounting substrate 1 are thinner, the end portions of the third peripheral portion 8b and the third land 8a portion are thinned, and further form the curved portions, so that the respective insulating layers are easily deformed along the end portion of the third electrical conductor layer 8. Thus, it is possible to reduce the generation of a space between the wiring layer and the insulating layer, which makes it possible to reduce the decrease in strength of the electronic element mounting substrate.

In a plan perspective, in the first electrical conductor layer 6 and the second electrical conductor layer 7, the first clearance portion 6c has the second portion 6f that does not overlap the second clearance portion 7c. That is, the first clearance portion 6c is different in size and/or shape from the second clearance portion 7c. Further, the first peripheral portion 6b and the second peripheral portion 7b of the substrate 2 have the end portions that become thinner as the distance from the via conductor 5 increases. This makes it possible to reduce the occurrence of unevenness on the surface of the electronic element mounting substrate 1. Further, it is possible to reduce the generation of a space between the wiring layer and the insulating layer, which makes it possible to reduce the decrease in strength of the electronic element mounting substrate.

A material constituting the third electrical conductor layer 8 and a manufacturing method thereof can be a material and manufacturing method similar to those of the first electrical conductor layer 6 and the second electrical conductor layer 7 described above.

Fourth Embodiment

The electronic element mounting substrate 1 according to a fourth embodiment of the present disclosure will be described next with reference to FIG. 12.

The electronic element mounting substrate 1 according to the present embodiment is different from the electronic element mounting substrate 1 according to the first embodiment in that in a cross-sectional view, the other electrical conductor layer 9 is provided between the first electrical conductor layer 6 and the second electrical conductor layer 7, and a part thereof has a wire shape pattern.

Figure 12:
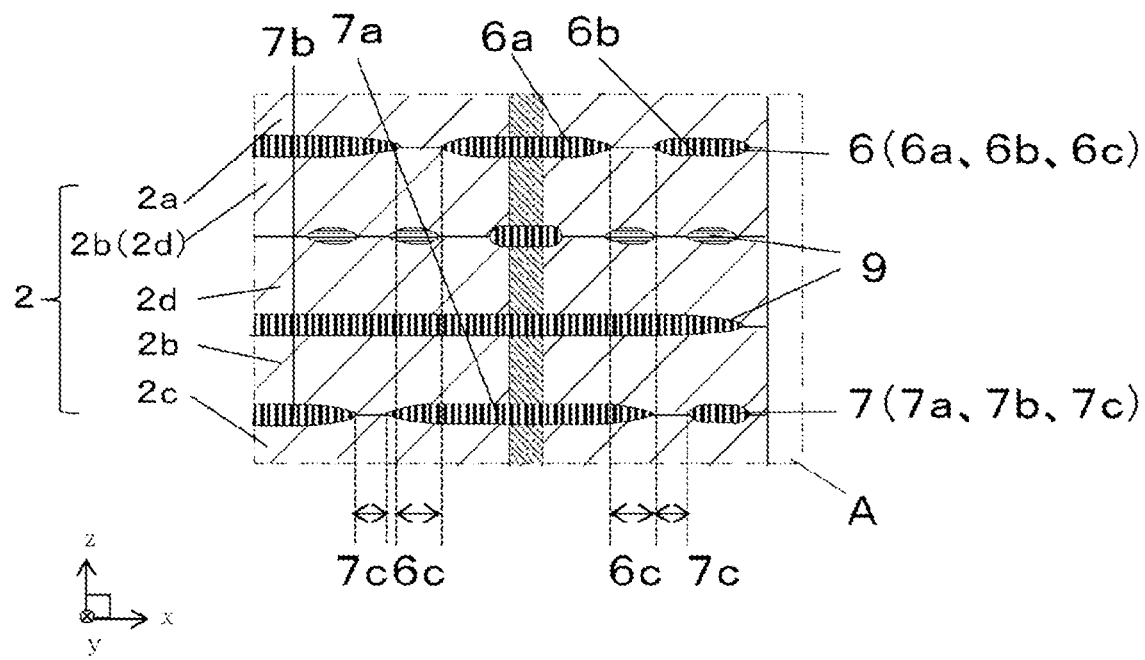
FIG. 12 is an enlarged vertical sectional view of a main part A of an electronic element mounting substrate according to a fourth embodiment of the present disclosure.

In the example illustrated in FIG. 12, the electronic element mounting substrate 1 includes the other electrical conductor layer 9 between the first electrical conductor layer 6 and the second electrical conductor layer 7 and a part thereof has the wire shape pattern, in a cross-sectional view. In such a case as well, the effect of the present embodiment can be obtained.

In this case, the wire shape pattern may be located at a position where the wire shape pattern overlaps the first clearance portion 6c and/or the second clearance portion 7c in a plan perspective. As a result, the other electrical conductor layer 9 having the wire shape pattern is located so as to fill the first clearance portion 6c and/or the second clearance portion 7c, so that it is possible to further reduce the occurrence of unevenness on the surface of the electronic element mounting substrate 1.

The present disclosure is not limited to the above-described embodiments, and various modifications can be made to numerical values and the like. Further, for example, in the examples illustrated in the respective figures, the electrode pads 3 have a rectangular shape in a top view, but may be circular or have another polygonal shape. The arrangement, number, and shape of the electrode pads 3, the mounting method of the electronic element, and the like in the above-described embodiments are not specified. Note that, various combinations of feature portions in the above-described embodiments are not limited to the examples of the above-described embodiments. Further, the combinations of the respective embodiments are also possible.

REFERENCE SIGNS LIST

1 Electronic element mounting substrate
2 Substrate
2a First layer
2b Second layer
2c Third layer
2d Another layer
3 Electrode pad
5 Via conductor
6 First electrical conductor layer
6a First land portion
6b First peripheral portion
6c First clearance portion
6d First end portion
6e First portion
6f Second portion
7 Second electrical conductor layer
7a Second land portion
7b Second peripheral portion
7c Second clearance portion
7d Second end portion
8 Third electrical conductor layer
8a Third land portion
8b Third peripheral portion
8c Third clearance portion
9 Another electrical conductor layer
10 Electronic element
12 Lid
13 Electronic element bonding member
14 Lid bonding member
21 Electronic device
31 Electronic module
32 Casing
r1 First radius
r2 Second radius

The invention claimed is:

1. An electronic element mounting substrate comprising:
a substrate comprising a first layer, a second layer located on a lower surface of the first layer, and a third layer located on a lower surface of the second layer, and on which an electronic element is to be mounted;

a via conductor passing through from the first layer to the third layer in a vertical direction;

a first electrical conductor layer located between the first layer and the second layer and connected to the via conductor in a plan perspective; and a second electrical conductor layer located between the second layer and the third layer and connected to the via conductor in a plan perspective, wherein the first electrical conductor layer comprises, in a plan perspective, a first land portion surrounding the via conductor and connected to the via conductor, a first clearance portion surrounding the first land portion, and a first peripheral portion surrounding the first clearance portion and electrically insulated from the first land portion with the first clearance portion interposed between the first land portion and the first peripheral portion, the second electrical conductor layer comprises, in a plan perspective, a second land portion surrounding the via conductor and connected to the via conductor, a second clearance portion surrounding the second land portion, and a second peripheral portion surrounding the second clearance portion and electrically insulated from the second land portion with the second clearance portion interposed between the second land portion and the second peripheral portion, the first land portion comprises, in a plan perspective, a first portion overlapping the second land portion, the first clearance portion comprises, in a plan perspective, a second portion not overlapping the second clearance portion, and the first peripheral portion and the second peripheral portion each comprise, in a vertical cross-sectional view, an end portion that becomes thinner as a distance from the via conductor increases, wherein the entire first clearance portion overlaps the second peripheral portion in a plan perspective.

2. The electronic element mounting substrate according to claim 1, wherein the entire second clearance portion overlaps the first land portion in a plan perspective.

3. The electronic element mounting substrate according to claim 1, wherein an outer edge of the first clearance portion has a circular shape with a first radius in a plan perspective, and an outer edge of the second clearance portion has a circular shape with a second radius different from the first radius.

4. The electronic element mounting substrate according to claim 1, wherein a distance from an outer edge of the first clearance portion to an outer edge of the second clearance portion is not constant in a plan perspective.

5. The electronic element mounting substrate according to claim 1, wherein each outer end of the first peripheral portion and the second peripheral portion is curved in a vertical cross-sectional view.

6. An electronic device comprising:

the electronic element mounting substrate according to claim 1; and an electronic element mounted on the electronic element mounting substrate.

7. An electronic module comprising:

the electronic device according to claim 6; and a casing surrounding the electronic device.

8. An electronic element mounting substrate comprising:

a substrate comprising a first layer, a second layer located on a lower surface of the first layer, and a third layer located on a lower surface of the second layer, and on which an electronic element is to be mounted;

a via conductor passing through from the first layer to the third layer in a vertical direction;

a first electrical conductor layer located between the first layer and the second layer and connected to the via conductor in a plan perspective; and a second electrical conductor layer located between the second layer and the third layer and connected to the via conductor in a plan perspective, wherein the first electrical conductor layer comprises, in a plan perspective, a first land portion surrounding the via conductor and connected to the via conductor, a first clearance portion surrounding the first land portion, and a first peripheral portion surrounding the first clearance portion and electrically insulated from the first land portion with the first clearance portion interposed between the first land portion and the first peripheral portion, the second electrical conductor layer comprises, in a plan perspective, a second land portion surrounding the via conductor and connected to the via conductor, a second clearance portion surrounding the second land portion, and a second peripheral portion surrounding the second clearance portion and electrically insulated from the second land portion with the second clearance portion interposed between the second land portion and the second peripheral portion, the first land portion comprises, in a plan perspective, a first portion overlapping the second land portion, the first clearance portion comprises, in a plan perspective, a second portion not overlapping the second clearance portion, and the first peripheral portion and the second peripheral portion each comprise, in a vertical cross-sectional view, an end portion that becomes thinner as a distance from the via conductor increases, wherein the entire second clearance portion overlaps the first peripheral portion in a plan perspective.

9. The electronic element mounting substrate according to claim 8, wherein the entire first clearance portion overlaps the second land portion in a plan perspective.

10. The electronic element mounting substrate according to claim 8, wherein an outer edge of the first clearance portion has a circular shape with a first radius in a plan perspective, and an outer edge of the second clearance portion has a circular shape with a second radius different from the first radius.

11. The electronic element mounting substrate according to claim 8, wherein a distance from an outer edge of the first clearance portion to an outer edge of the second clearance portion is not constant in a plan perspective.

12. An electronic device comprising:

the electronic element mounting substrate according to claim 8; and an electronic element mounted on the electronic element mounting substrate.

13. An electronic element mounting substrate comprising:

a substrate comprising a first layer, a second layer located on a lower surface of the first layer, and a third layer located on a lower surface of the second layer, and on which an electronic element is to be mounted;

a via conductor passing through from the first layer to the third layer in a vertical direction;

a first electrical conductor layer located between the first layer and the second layer and connected to the via conductor in a plan perspective; and a second electrical conductor layer located between the second layer and the third layer and connected to the via conductor in a plan perspective, wherein the first electrical conductor layer comprises, in a plan perspective, a first land portion surrounding the via conductor and connected to the via conductor, a first clearance portion surrounding the first land portion, and a first peripheral portion surrounding the first clearance portion and electrically insulated from the first land portion with the first clearance portion interposed between the first land portion and the first peripheral portion, the second electrical conductor layer comprises, in a plan perspective, a second land portion surrounding the via conductor and connected to the via conductor, a second clearance portion surrounding the second land portion, and a second peripheral portion surrounding the second clearance portion and electrically insulated from the second land portion with the second clearance portion interposed between the second land portion and the second peripheral portion, the first land portion comprises, in a plan perspective, a first portion overlapping the second land portion, the first clearance portion comprises, in a plan perspective, a second portion not overlapping the second clearance portion, and the first peripheral portion and the second peripheral portion each comprise, in a vertical cross-sectional view, an end portion that becomes thinner as a distance from the via conductor increases, wherein the entire second clearance portion overlaps the first land portion in a plan perspective.

14. The electronic element mounting substrate according to claim 13, wherein the entire first clearance portion overlaps the second peripheral portion in a plan perspective.

15. The electronic element mounting substrate according to claim 13, wherein an outer edge of the first clearance portion has a circular shape with a first radius in a plan perspective, and an outer edge of the second clearance portion has a circular shape with a second radius different from the first radius.

16. The electronic element mounting substrate according to claim 13, wherein a distance from an outer edge of the first clearance portion to an outer edge of the second clearance portion is not constant in a plan perspective.

17. The electronic element mounting substrate according to claim 13, wherein each outer end of the first peripheral portion and the second peripheral portion is curved in a vertical cross-sectional view.

18. An electronic device comprising:

the electronic element mounting substrate according to claim 13; and an electronic element mounted on the electronic element mounting substrate.

\* \* \* \* \*